United States Patent [19]

Higuchi

[11] Patent Number: 5,671,180

[45] Date of Patent: Sep. 23, 1997

[54] SEMICONDUCTOR MEMORY DEVICE WITH FUNCTION OF PREVENTING LOSS OF INFORMATION DUE TO LEAK OF CHARGES OR DISTURBING

[75] Inventor: Mitsuo Higuchi, Kawasaki, Japan

[73] Assignee: Fujitsu Limited, Kawasaki, Japan

[21] Appl. No.: 709,724

[22] Filed: Sep. 9, 1996

Related U.S. Application Data

[62] Division of Ser. No. 593,270, Jan. 29, 1996, Pat. No. 5,586,074, which is a continuation of Ser. No. 141,101, Oct. 26, 1993, abandoned.

[30] Foreign Application Priority Data

Oct. 27, 1992 [JP] Japan .................................. 4-288826

[51] Int. Cl.[6] ........................................... G11C 29/00
[52] U.S. Cl. ............................. 365/185.21; 365/185.22; 365/200; 365/210
[58] Field of Search ......................... 365/185.21, 185.22, 365/200, 210, 185.09

[56] References Cited

U.S. PATENT DOCUMENTS

| | | | |
|---|---|---|---|
| 4,809,224 | 2/1989 | Suzuki et al. | 365/168 |
| 5,043,940 | 8/1991 | Harari | 365/185 |
| 5,124,945 | 6/1992 | Schreck | 365/185.22 |
| 5,142,496 | 8/1992 | Van Busuiru | 365/185.22 |
| 5,293,345 | 3/1994 | Iwahashi | 365/185.21 |

*Primary Examiner*—Tan T. Nguyen
*Attorney, Agent, or Firm*—Nikaido, Marmelstein, Murray & Oram LLP

[57] ABSTRACT

An electrically erasable and programmable read-only semiconductor memory includes a cell array portion formed by arranging in matrix a plurality of memory cell portions each having a cell transistor, a unit for selecting a cell transistor of the cell array portion, and a read circuit for generating a plurality of data, for each of a plurality of reference current values, for indicating whether or not a current value of a current flowing through a cell transistor selected and brought into a read state is greater than a plurality of reference current values inclusive of reference current values of the case where judgement is made as to whether the cell transistor brought into the read state is under the state where the cell transistor should be regarded as storing a first logical value, or under the state where the cell transistor should be regarded as storing a second logical value. This construction can detect in advance a cell transistor having the possibility of the loss of information, and acquires the chance for rewrite or the exchange of the cell transistor used. Accordingly, the loss of the information can be prevented and system reliability can be improved.

4 Claims, 6 Drawing Sheets

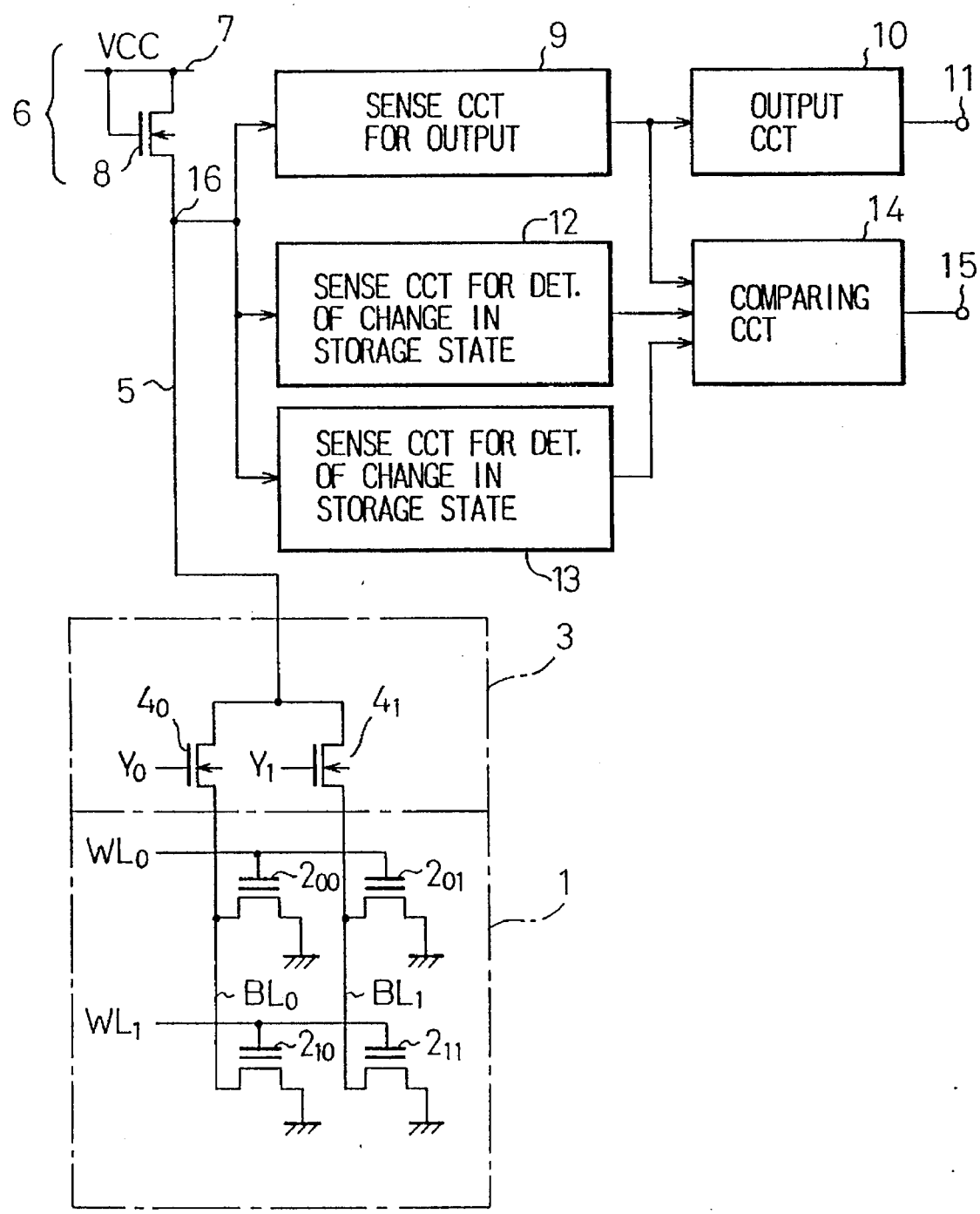

Fig.1b

| CELL CURRENT | --- | $I_2$ | --- | $I_1$ | --- | $I_3$ | --- |
|---|---|---|---|---|---|---|---|
| OUT. VALUE OF SENSE CCT 9 | 1 | 1 | 1 | 1 | 0 | 0 | 0 |
| OUT. VALUE OF SENSE CCT 12 | 1 | 1 | 0 | 0 | 0 | 0 | 0 |
| OUT. VALUE OF SENSE CCT 13 | 1 | 1 | 1 | 1 | 1 | 0 | 0 |
| OUT. VALUE OF COM. CCT 14 | 1 | 1 | 0 | 0 | 0 | 1 | 1 |

Fig.3b

| CELL CURRENT | $I_2$ | --- | $I_1$ | --- | $I_3$ | --- |
|---|---|---|---|---|---|---|
| OUT. VALUE OF SENSE CCT 22 WHEN Tr19=ON, Tr20=OFF, AND Tr21=OFF | 1 | 1 | 1 | 1 | 0 | 0 |
| OUT. VALUE OF SENSE CCT 22 WHEN Tr19=ON, Tr20=ON, AND Tr21=OFF | 1 | 1 | 1 | 0 | 0 | 0 |
| OUT. VALUE OF SENSE CCT 22 WHEN Tr19=ON, Tr20=ON, AND Tr21=ON | 1 | 1 | 0 | 0 | 0 | 0 |
| OUT. VALUE OF COM. CCT 26 | 1 | 1 | 0 | 0 | 1 | 1 |

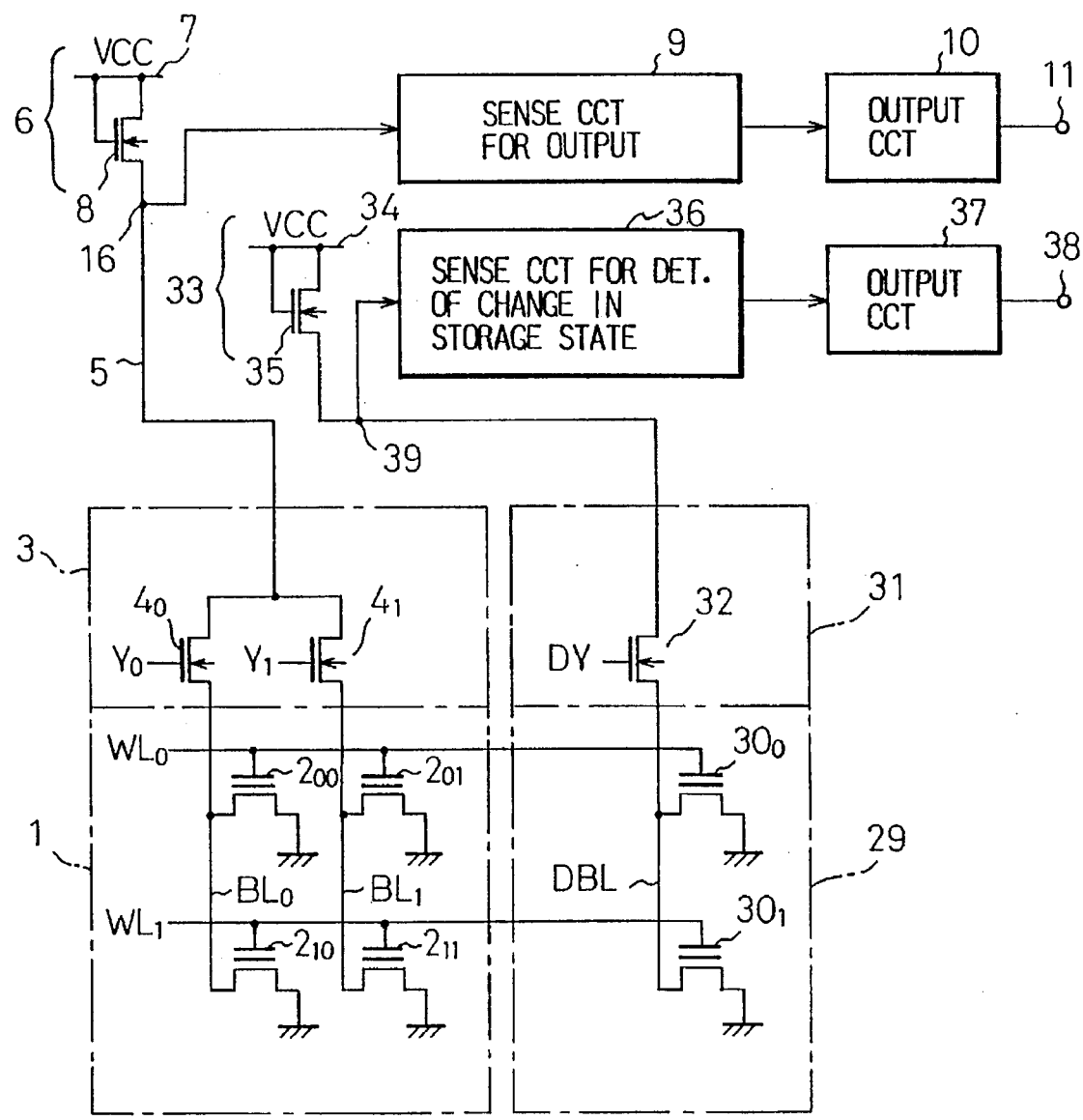

1

SEMICONDUCTOR MEMORY DEVICE WITH FUNCTION OF PREVENTING LOSS OF INFORMATION DUE TO LEAK OF CHARGES OR DISTURBING

This is a division of application Ser. No. 08/593,270 filed Jan. 29, 1996, now U.S. Pat. No. 5,586,074, which in turn is a continuation of application Ser. No. 08/141,101 filed Oct. 26, 1993, now abandoned.

BACKGROUND OF THE INVENTION

1. Field of the Invention

This invention relates to a semiconductor memory device, and more particularly, to an electrically erasable and programmable read-only memory (hereinafter referred to as "EEPROM") such as a flash memory.

2. Description of the Related Art

In EEPROMs, storage of information is generally effected by accumulating charges in a conductor called a "floating gate" which is disposed in a transistor (a so-called "cell transistor") of a memory cell portion, and which is electrically insulated from other portions.

Therefore, when leak occurs due to breakage or defect of an insulating film surrounding the floating gate, the charges accumulated in the floating gate disappear and the information is destroyed.

When EEPROMs are shipped from a production plant, writing and reading of information are effected, and EEPROMs which include any defective cell transistor or transistors are rejected. Furthermore, after information is stored in the EEPROMs, they are left lying in a high temperature environment for a predetermined period, presence of the loss of information is checked, and only EEPROMs free from the loss of information are shipped.

However, since rewriting of the EEPROM is made on the user side during use, too, leak resulting from breakdown of the cell transistor and from deterioration of the insulating film surrounding the floating gate occurs, and there is the possibility that the charges accumulated disappear during use and the information is destroyed.

When writing and erasing are repeatedly effected for the cell transistor, a so-called, "disturbing", in which the information of other cell transistors disappears due to the influences of a voltage applied to a given cell transistor, occurs, particularly in a flash memory which has become predominant in recent years.

Breakdown of the cell transistor mostly occurs at the time of rewriting, and can be detected by reading out the information immediately after the information is re-written. However, since the loss of charges of the floating gate due to leak and disturbing gradually develops, it cannot be detected by reading out the stored information of the cell transistor immediately after the rewrite operation. The loss of the information is mostly found out when the stored information of the cell transistor is later read out, and thus repair of the information is difficult.

Conventionally, repair of the information which is destroyed during use has been carried out by incorporating an ECC (Error Check and Correct) circuit into EEPROMs.

When the ECC circuit is built in, the major portion of random defects of the cell transistors can be relieved, but there are posed the problems that excessive cell transistors become necessary, peripheral circuits inside the device become more complicated, and the increase of the device area and its fabrication cost are invited.

SUMMARY OF THE INVENTION

An object of the present invention is to provide a semiconductor memory device which detects in advance those cell transistors, which might invite the loss of the information, by a circuit construction not inviting the increase of the device area and the fabrication cost, can obtain the chance of changing the cell transistors used, thereby prevents the loss of the information, and can improve reliability of a system.

According to a first aspect of the present invention for accomplishing the object described above, there is provided an electrically erasable and programmable semiconductor memory device which comprises a cell array portion formed by arranging in matrix a plurality of memory cell portions each having a cell transistor; means for selecting a cell transistor of the cell array portion; and a read circuit for generating a plurality of data, for each of a plurality of reference current values, for indicating whether or not a current value of a current flowing through the cell transistor selected and brought into a read state is greater than a plurality of the reference current values inclusive of reference current values of the case where judgement is made as to whether the cell transistor brought into the read state is under the state where the cell transistor should be regarded as storing a first logical value, or under the state where the cell transistor should be regarded as storing a second logical value.

Also, according to a second aspect of the present invention, there is provided an electrically erasable and programmable read-only semiconductor memory device which comprises a first cell array portion formed by arranging, in matrix, a plurality of memory cell portions each having a cell transistor for storing information; a second cell array portion formed by arranging, in matrix, a plurality of memory cell portions each including a memory state change detection cell transistor for detecting the change of the memory state of the cell transistor for storing the information; means for selecting cell transistor for storing information in the first cell array portion; a first sense circuit for reading out the stored information of the cell transistor for storing information selected; and a second sense circuit having a threshold level different from that of the first sense circuit, for reading out the stored information of the cell transistor when the memory state change detection transistor in the second cell array portion is selected.

In the first aspect of the present invention described above, it is possible to obtain a plurality of data which indicate, for each of a plurality of reference current values, whether or not a current value flowing through the cell transistor brought into the read state is greater than the plurality of reference current values inclusive of reference current values of the case where the cell transistor brought into the read state is under the state where it should be regarded as storing the first logical value, or under the state where it should be regarded as storing the second logical value.

As a result, the change of a quantity of the charge accumulated in the floating gate of the cell transistor brought into the read state can be detected within the range which is determined by the reference current values.

In other words, it is possible to detect the cell transistor having the possibility of the reduction of the charge accumulated in the floating gate and the loss of the information due to leak and disturbing resulting from breakdown and deterioration of the insulating film surrounding the floating gate.

According to the first aspect of the present invention, therefore, it is possible to acquire the chance for rewrite to the cell transistor in which the charge accumulated in the floating gate thereof decreases due to leak and disturbing, and for the exchange of the cell transistor used, and to thus prevent the loss of the information.

On the other hand, the second aspect of the present invention includes memory state change detection cell transistors for detecting the change of the memory state, besides the information storage cell transistor for storing the information, and, as the sense circuit for reading out the stored information of the memory state change detection cell transistors, the first sense circuit for reading out the stored data of the cell transistor for storing the information, and the second sense circuit for detecting the change of the memory state, which has a different sense point from that of the first sense circuit.

As a result, the cell transistor in which the charge accumulated in the floating gate thereof due to disturbing can be detected by reading out the memory state change detection cell transistor.

Therefore, according to the second embodiment of the present invention, it is possible to acquire the chance for rewrite to the cell transistor in which the charge accumulated in the floating gate drops due to disturbing, and the exchange of the cell transistor used, and to thus prevent the loss of the information.

BRIEF DESCRIPTION OF THE DRAWINGS

Other objects and features of the present invention will be described hereinafter in detail by way of preferred embodiments thereof with reference to the accompanying drawings, in which:

FIGS. 1a and 1b show the construction of principal portions of a semiconductor memory device according to the first embodiment of the present invention, and a diagram showing the relationship between a cell current of cell transistors under a read state and the output of each circuit, respectively;

FIGS. 3a and 3b show the construction of principal portions of a semiconductor memory device according to the second embodiment of the present invention, and a diagram showing the relationship between a cell current of cell transistors under a read state and the output of each circuit, respectively; and FIG. 4 is a diagram showing the construction of principal portions of a semiconductor memory device according to the third embodiment of the present invention.

DESCRIPTION OF THE PREFERRED EMBODIMENTS

Figure 2:
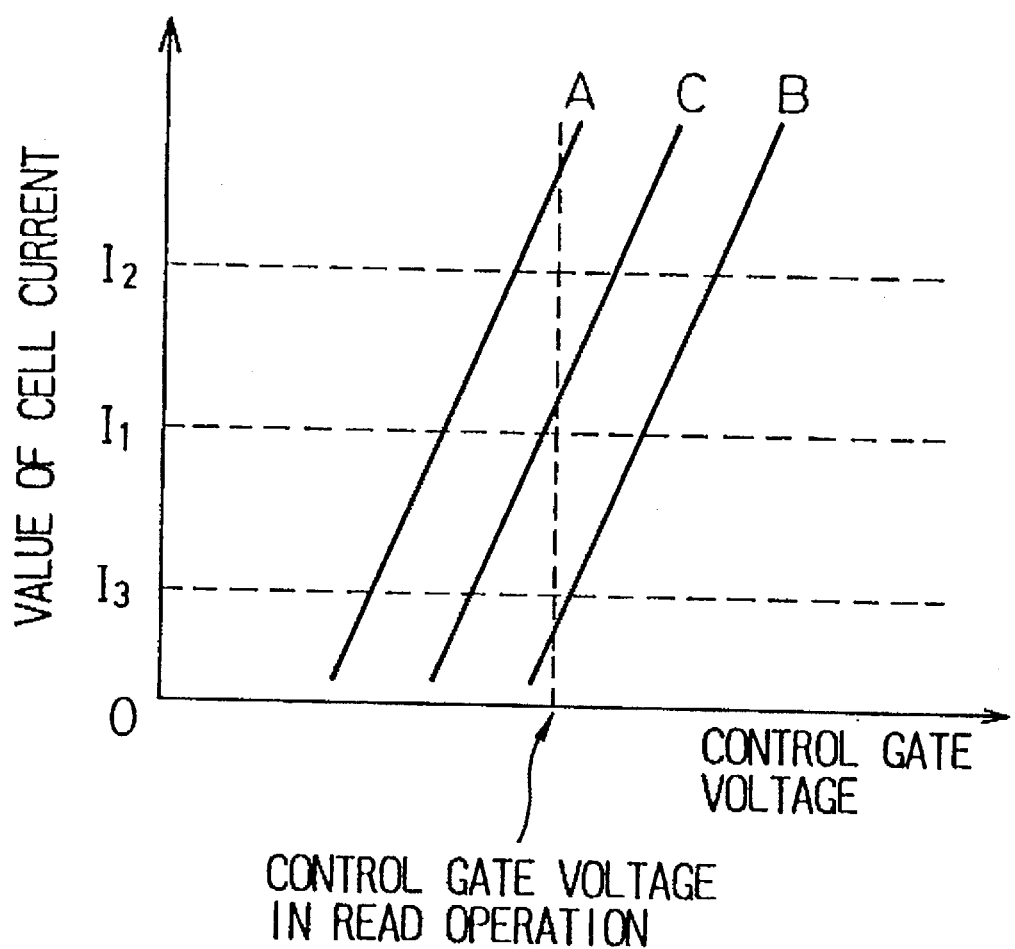
FIG. 2 is a graph showing the relationship between a control gate of a cell transistor and a cell current.

Throughout the following description, the same reference numeral used in conjunction with the drawings represents the same constituent element, and repetition of the explanation thereof will be omitted.

Preferred embodiments of the present invention will be explained in detail with reference to FIGS. 1a to 4. By the way, in the following description, the explanation will be made about the case where the present invention is applied to a flash memory.

FIGS. 1a and 1b typically show the semiconductor memory device according to the first embodiment of the present invention. FIG. 1a shows the construction of principal portions of the semiconductor memory device, and FIG. 1b shows the relationship between a cell current of a cell transistor under a read state and the output of each circuit.

In FIG. 1a, reference numeral 1 denotes a cell array portion; $2_{00}$ to $2_{11}$ are cell transistors (only four cell transistors are shown in the drawing for simplifying the explanation in the embodiment shown in the drawing); $WL_0$ and $WL_1$ are word lines; and $BL_0$ and $BL_1$ are bit lines. Reference numeral 3 denotes a bit line select circuit (column select circuit); $Y_0$ and $Y_1$ are bit line select signals outputted from a column decoder (not shown in the drawings); and $4_0$ and $4_1$ are n-MOS transistors for selecting the bit lines, ON/OFF of which is controlled by the bit line select signals $Y_0$ and $Y_1$, respectively. Reference numeral 5 denotes a data bus which is used in common by each bit line $BL_0$, $BL_1$, and reference numeral 6 denotes a load circuit. In this load circuit, reference numeral 7 denotes a power supply line for supplying a power supply voltage VCC, and reference numeral 8 denotes an n-MOS transistor which constitutes a load transistor.

Reference numeral 9 denotes an output sense circuit for detecting the stored information of the selected cell transistor; reference numeral 10 denotes an output circuit for outputting to the outside the stored information detected by the output sense circuit 9; and reference numeral 11 denotes an output terminal of the stored information.

Reference numerals 12 and 13 denote sense circuits for detecting the change of the memory state, which detect the change of the memory state of the selected cell transistors, 14 is a comparison circuit for combining the output values of the sense circuits 9, 12 and 13 and generating a comparison result, and 15 is an output terminal for outputting the comparison result to the outside.

FIG. 2 shows the relationship between the control gate voltage of the cell transistor and a current value of a current flowing through the cell transistor (so-called "cell current"). The current value of the cell current changes while depending on the charge quantity accumulated in the floating gate.

In FIG. 2, reference numeral $I_1$ denotes a reference current value as the reference for the judgement whether the cell transistor should be regarded as being under the erase state or under the write state, or in other words, whether the cell transistor should be regarded as storing "1" or "0". In this case, when the current value of the cell current is above the reference current value $I_1$, the cell transistor is judged as being under the storing state of "1", and when the current value of the cell current is less than the reference current value $I_1$, the cell transistor is judged as being under the storing state of "0".

Reference numeral $I_2$ denotes the reference current value as the reference for the judgement whether or not the cell transistor is under a sufficient erase state, or in other words, whether or not the cell transistor is under a sufficient storing state of "1". In this case, when the current value of the cell current is above the reference current value $I_2$, the cell transistor is judged as being under the "1" storing state and when the current value of the cell current is less than the reference current value $I_2$, the cell transistor is judged as being out of the "1" storing state.

Reference numeral $I_3$ denotes a reference current value as the reference for the judgement whether or not the cell transistor is under a sufficient write state, or in other words, whether or not the cell transistor is under a sufficient "0" storing state. In this case, when the current value of the cell current is below the reference current value $I_3$, the cell transistor is judged as being under the "0" storing state, and when the cell current exceeds the reference current value $I_3$, the cell transistor is judged as being out of the "0" storing state.

A straight line A represents the relationship between the control gate voltage of the cell transistor and the current value of the cell current under the state where the floating gate exists sufficiently at a positive potential (that is, the state where the cell transistor sufficiently stores "1").

A straight line B represents the relationship between the control gate voltage of the cell transistor and the current value of the cell current under the state where the floating gate exists sufficiently at a negative potential (that is, the state where the cell transistor sufficiently stores "0").

A straight line C represents the relationship between the control gate voltage of the cell transistor and the current value of the cell current under the state where the charge stored in the floating gate is insufficient (that is, the state where the cell transistor cannot be said as sufficiently storing "1" or the state where the cell transistor cannot be said as sufficiently storing "0").

Referring again to FIG. 1a, the sense circuit 9 for the output is constituted in such a manner that it uses, as a sense point (a threshold level), the voltage occurring at a node 16 when the current value of the cell current is the reference current value $I_1$ under the state where the cell transistor is under the read state, outputs "1" by regarding the cell transistor, which is under the read state, as storing "1" when the current value of the cell current is above the reference current value $I_1$, and outputs "0" by regarding the cell transistor under the read state as storing "0" when the current value of the cell current is less than the reference current value $I_1$.

The sense circuit 12 for detecting the change of the memory state is constituted in such a manner that it uses, as the sense point (the threshold level), the voltage occurring at the node 16 when the current value of the cell current is the reference current value $I_2$ under the state where the cell transistor is under the read state, outputs "1" by regarding the cell transistor under the read state as storing "1" when the current value of the cell current is above the reference current value $I_2$, and outputs "0" by regarding the cell transistor as being out of the sufficient "1" storing state when the current value of the cell current is less than the reference current value $I_2$.

The sense circuit 13 for detecting the change of the memory state is constituted in such a manner that it uses, as the sense point (the threshold level), the voltage occurring at the node 16 when the current value of the cell current is the reference current value $I_3$ under the state where the cell transistor is under the read state, outputs "0" by regarding the cell transistor under the read state as storing "0", and outputs "1" by regarding the cell transistor as being out of the sufficient "0" storing state when the current value of the cell current exceeds the reference current value $I_3$.

The comparison circuit 14 is constituted in such a manner as to output "1" when the output values of all the sense circuits 9, 12 and 13 coincide with one another, and to output "0" when they do not.

For reference, FIG. 1b shows the relationship between the current values of the cell current when the cell transistor is brought into the read state, the output value of each of the sense circuits 9, 12, 13 and the output value (comparison result) of the comparison circuit 14.

In this embodiment, when the negative charge is fully accumulated in the floating gate of the cell transistor $2_{00}$, such as when the cell transistor $2_{00}$ indicates the characteristics represented by the straight line B in FIG. 2, for example, let's consider the case where the stored information of this cell transistor $2_{00}$ is read out.

In this case, the bit select signal $Y_0$ is set to a VCC level, the bit line select signal $Y_1$ is set to a VSS level (ground level), the n-MOS transistor $4_0$ is turned ON, the n-MOS transistor $4_1$ is turned OFF, the word line $WL_0$ is set to the VCC level and the word line $WL_1$ is set to the VSS level.

The cell current of the cell transistor $2_{00}$ is below the reference current value $I_3$, the output of the sense circuit 9 for the output is "0", the output of each sense circuit 12, 13 for detecting the change of the memory state is "0", and the output value of the comparison circuit 14 is "1". It is possible to judge that this cell transistor $2_{00}$ sufficiently stores "1" or "0".

In other words, it is possible to confirm that the cell transistor $2_{00}$ is not under the state where the charge accumulated in the floating gate is reduced by the leak or disturbing resulting from breakdown or deterioration of the insulating film surrounding the floating gate, and that rewrite and the change of the cell transistor to be used are not necessary.

Next, assuming that the positive charge is sufficiently accumulated in the floating gate of the cell transistor $2_{11}$ such as when the cell transistor $2_{11}$ indicates the characteristics represented by the straight line A in FIG. 2, and under this state, the stored information of this cell transistor $2_{11}$ is read out.

In this case, the bit line select signal $Y_0$ is set to the VSS level, the bit line select signal $Y_1$ is set to the VCC level, the n-MOS transistor $4_0$ is turned OFF, the n-MOS transistor $4_1$ is turned ON, the word line $WL_0$ is set to the VSS level, and the word line $WL_1$ is set to the VCC level.

The cell current of the cell transistor $2_{11}$ is above the reference current value $I_2$, the output of the sense circuit 9 for the output is "1", the output of each of the sense circuits 12, 13 for detecting the change of the memory state is "1", and the output value of the comparison circuit 14 is "1". It is possible to judge that this cell transistor $2_{11}$ is under the state where it sufficiently stores "1" or "0".

In other words, the cell transistor $2_{11}$ is not under the state where the charge accumulated in the floating gate is reduced due to the leak or disturbing resulting from breakdown or deterioration of the insulating film surrounding the floating gate, and it is possible to confirm that rewrite and the change of the cell transistor to be used are not necessary.

Next, assuming that the charge accumulated in the floating gate of the cell transistor $2_{10}$ is reduced due to the leak or disturbing resulting from breakdown or deterioration of the insulating film surrounding the floating gate, and under this state, the stored information of this cell transistor $2_{10}$ is read out.

In this case, the bit select signal $Y_0$ is set to the VCC level, the bit line select signal $Y_1$ is set to the VSS level, the n-MOS transistor $4_0$ is turned ON, the n-MOS transistor $4_1$ is turned OFF, the word line $WL_0$ is set to the VSS level and the word line $WL_1$ is set to the VCC level.

The cell current flowing the cell transistor $2_{10}$ is a current value between the reference current value $I_2$ and the reference current value $I_3$. However, when this cell current is above the reference current value $I_1$, the output of the sense circuit 9 for the output is "1", the output of the sense circuit 12 for detecting the change of the memory state is "0", and the output of the sense circuit 13 for detecting the change of the memory state is "1".

In contrast, when the cell current is less than the reference current value $I_1$, the output of the sense circuit 9 for the output is "0", the output of the sense circuit 12 for detecting the change of the memory state is "0", and the output of the sense circuit 13 for detecting the change of the memory state is "1".

In these cases, the output value of the comparison circuit 14 is "0", and it can be known that the charge accumulated in the floating gate is reduced due to breakdown or deterioration of the insulating film surrounding the floating gate in the cell transistor $2_{10}$.

As a result, it is possible to obtain the chance for effecting rewrite to the cell transistor $2_{10}$ in which the charge accumulated in the floating gate is reduced, and for changing the cell transistor to be used.

By the way, rewrite and the change of the cell transistor used can be made by the use of a control circuit outside the device, and it is also possible to dispose a control circuit for changing the cell transistor used and to use this control circuit for rewrite and change of the cell transistor used.

Detection of the change of the memory state of the cell transistor and rewrite or switching of the cell transistor used is preferably made at the time of turning-ON of power supply and this is efficient from the aspect of the system operation.

As described above, according to this embodiment, it is possible to detect in advance the cell transistor having the possibility of loss of the information and to acquire the chance of rewrite and the change of the cell transistor to be used. Accordingly, the embodiment can prevent the loss of the information and can improve reliability of the system.

According to this embodiment, further, the intended object can be accomplished by merely adding the sense circuits 12, 13 for detecting the change of the memory state and the comparison circuit 14. Accordingly, in comparison with the case where the ECC circuit is built in as in the prior art device, this embodiment does not invite the increase of the device area and the production cost.

Although this embodiment has been explained about the case where two sense circuits 12, 13 are disposed as the sense circuit for detecting the change of the memory state, it is possible to dispose either one of the sense circuits 12 and 13.

Figure 3A:
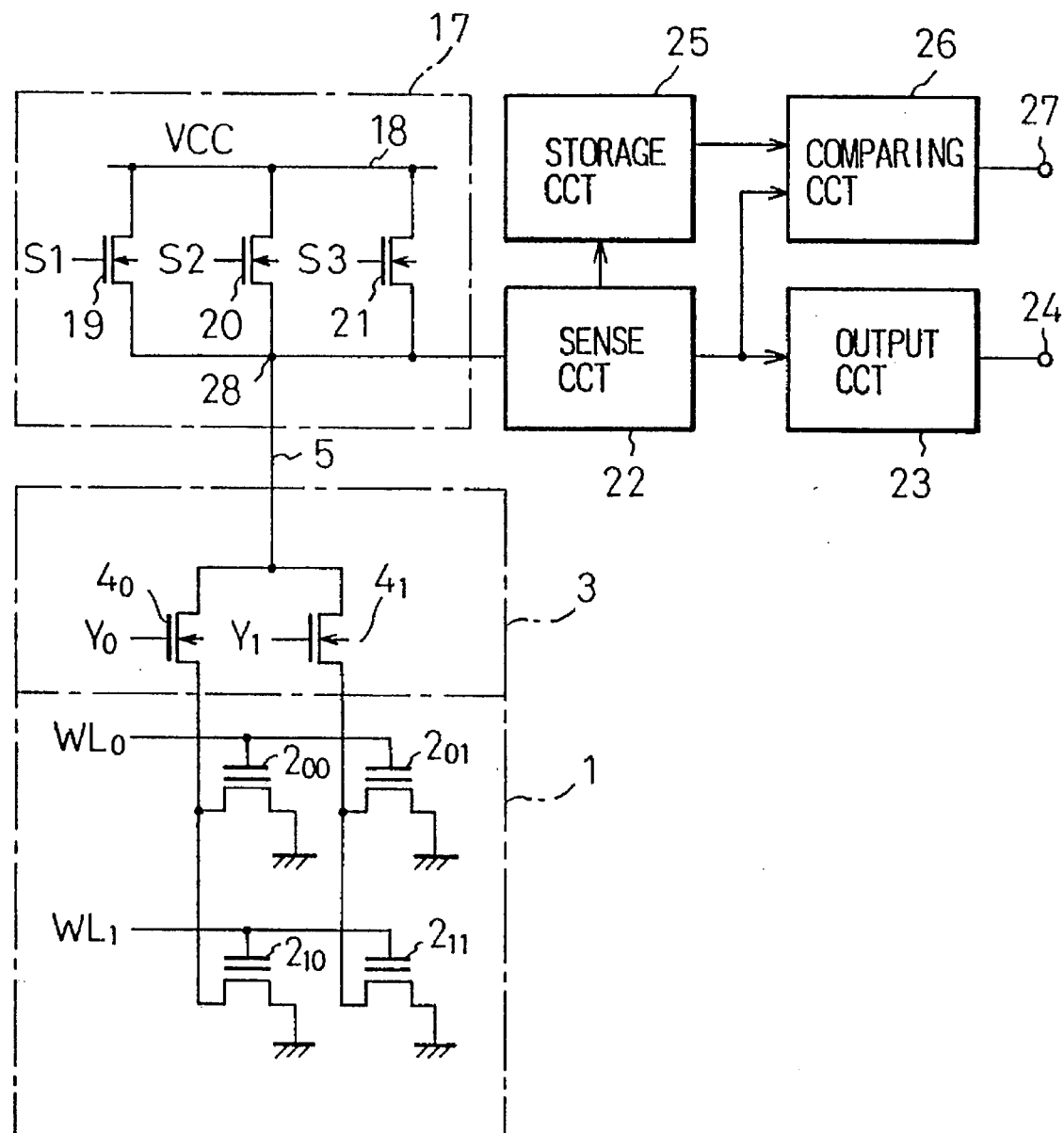

FIGS. 3a and 3b typically show the semiconductor memory device according to the second embodiment of the present invention. FIG. 3a shows the construction of the principal portions of the semiconductor memory device, and FIG. 3b shows the relationship between the cell current of the cell transistor under the read state and the output of each circuit.

In this embodiment, the cell array portion 1, the bit line select circuit 3 and the data bus 5 are constituted in the same way as in the first embodiment shown in FIG. 1a. The following description will explain the difference from the first embodiment.

In FIG. 3a, reference numeral 17 denotes a load circuit for suitably selecting a resistance value and capable of changing it, 18 is a power supply line for supplying the power supply voltage VCC, 19 to 21 are n-MOS transistors that constitute load transistors in the load circuit 17, respectively, and S1 to S3 are control signals for effecting ON/OFF control of the n-MOS transistors 19 to 21, respectively.

Reference numeral 22 denotes a sense circuit, 23 is an output circuit for outputting the stored information of the selected cell transistor outputted from the sense circuit 22 to the outside, and 24 is the output terminal of the stored information.

Reference numeral 25 denotes a memory circuit for temporarily storing the information for detecting the change of the memory cell transistor obtained from the sense circuit 22, as will be later described.

Reference numeral 26 denotes a comparison circuit for comparing the information for detecting the change of the memory state of the cell transistor stored in the memory circuit 25 with the stored information of the cell transistor outputted from the sense circuit 22, and generating a comparison result, and 27 is an output terminal of the comparison result.

As to the n-MOS transistor 19, the size of this transistor 19 is decided so that the voltage occurring at a node 28 when the current value of the cell current is the reference current value $I_3$ (see FIG. 2) under the state where the n-MOS transistor 19 is ON and the n-MOS transistors 20, 21 is OFF, is a sense point (threshold level) of the sense circuit 22.

As to the n-MOS transistor 20, the size of this transistor 20 is decided so that the voltage occurring at the node 28 when the current value of the cell current is the reference current value $I_1$ (see FIG. 2) under the state where the n-MOS transistors 19, 20 are ON and the n-MOS transistor 21 is OFF, is the sense point (threshold level) of the sense circuit 22.

As to the n-MOS transistor 21, the size of this transistor 21 is decided so that the voltage occurring at the node 28 when the current value of the cell current is the reference current value $I_2$ (see FIG. 2) under the state where the n-MOS transistors 19, 20, 21 are all ON, is the sense point (threshold level) of the sense circuit 22.

In other words, the sense circuit 22 outputs "0" when the n-MOS transistor 19 is ON and the n-MOS transistors 20, 21 are OFF and when the current value of the cell current is below the reference current value $I_3$, by judging that the selected cell transistor is under the sufficient "0" storing state, and outputs "1" when the current value of the cell current exceeds the reference current value $I_3$, by judging that the selected cell transistor is out of the sufficient "0" storing state.

The sense circuit 22 outputs "1" when the n-MOS transistors 19, 20 are ON and the n-MOS transistor 21 is OFF and when the current value of the cell current is above the reference current value $I_1$, by judging that the selected cell transistor is under the state where it should be regarded as storing "1", and outputs "0" when the current value of the cell current is less than the reference current value $I_1$, by judging that the selected cell transistor is under the state where it should be regarded as storing "0".

The sense circuit 22 outputs "1" when the n-MOS transistors 19, 20, 21 are all ON and when the current value of the cell current is above the reference current value $I_2$, by judging that the selected cell transistor is under the sufficient "1" storing state, and outputs "0" when the current value of the cell current is less than the reference current value $I_2$, by judging that the selected cell transistor is out of the sufficient "1" storing state.

In this embodiment, the detection of the cell transistor, in which the charge accumulated in the floating gate gradually decreases due to the leak or disturbing resulting from breakdown and deterioration of the insulating film surrounding the floating gate, is effected in the following way.

First of all, as to the selected cell transistor, the output value of the sense circuit 22 when the n-MOS transistor 19 is ON and the n-MOS transistors 20, 21 are OFF (that is, the information for detecting the change of the memory state of the cell transistor) is stored in the memory circuit 25.

Next, the output value of the sense circuit 22 when the n-MOS transistors 19, 20, 21 are all ON (that is, the information for detecting the change of the memory state of the cell transistor) is stored in the memory circuit 25.

Next, the output value of the sense circuit 22 when the n-MOS transistors 19, 20 are ON and the n-MOS transistor 21 is OFF (that is, the memory information of the cell transistor) and two output values of the sense circuit 22 stored in the memory circuit 25 are compared with one another by the comparison circuit 26.

In this case, the comparison circuit 26 is so constituted as to output "1" when three output values of the sense circuit 22 are all coincident and to output "0" when these output values are not coincident.

For reference, FIG. 3b shows the relationship between the current value of the cell current when the cell transistor is under the read state, the output value of the sense circuit 22 and the output value (comparison result) of the comparison circuit 26.

When the negative charge is fully accumulated in the floating gate of the cell transistor $2_{00}$ in this embodiment such as when the cell transistor $2_{00}$ represents the characteristics indicated by the straight line B in FIG. 2, for example, let's consider the case where the stored information of this cell transistor $2_{00}$ is read out.

In this case, the output value of the sense circuit 22 is "0" when the cell current of the cell transistor $2_{00}$ is below the reference current value $I_3$, the n-MOS transistor 19 is ON and the n-MOS transistors 20, 21 are OFF, is also "0" when the n-MOS transistors 19, 20, 21 are all ON, and is "0" when the n-MOS transistors 19, 20 are ON and the n-MOS transistor 21 is OFF.

As a result, the output value of the comparison circuit 26 becomes "1", and it is possible to judge that this cell transistor $2_{00}$ is under the sufficient "1" or "0" storing state.

In other words, it is possible to confirm that the cell transistor $2_{00}$ is out of the state where the charge accumulated in the floating gate is reduced by the leak or disturbing resulting from breakdown and deterioration of the insulating film surrounding the floating gate, and rewrite and the change of the cell transistor used are not necessary.

Next, assuming that the positive charge is sufficiently accumulated in the floating gate of the cell transistor $2_{11}$ such as when the cell transistor $2_{11}$ represents the characteristics indicated by the straight line A in FIG. 2, and the stored information of this cell transistor $2_{11}$ is read out.

In this case, the output value of the sense circuit 22 is "1" when the cell current of the cell transistor $2_{11}$ is above the reference current value $I_2$, the n-MOS transistor 19 is ON and the n-MOS transistors 20, 21 are OFF, is "1" when the n-MOS transistors 19, 20, 21, are all ON, and is also "1" when the n-MOS transistors 19, 20 are ON and the n-MOS transistor 21 is OFF.

As a result, the output value of the comparison circuit 26 becomes "1", and it is possible to judge that this cell transistor $2_{11}$ is under the sufficient "1" or "0" storing state.

In other words, it is possible to confirm that the cell transistor $2_{11}$ is out of the state where the charge accumulated in the floating gate is reduced by the leak or disturbing resulting from breakdown and deterioration of the insulating film surrounding the floating gate, and rewrite and the change of the cell transistor used are not necessary.

Next, assuming that the stored information of the cell transistor $2_{10}$ is read out under the state where the charge stored in the floating gate of this transistor $2_{10}$ is reduced by the leak or disturbing resulting from breakdown and deterioration of the insulation film surrounding the floating gate.

In this case, the cell current of the cell transistor $2_{10}$ is a current value between the reference current value $I_2$ and the reference current value $I_3$. When the current value is above the reference current value $I_1$, the output value of the sense circuit 22 is "1" when the n-MOS transistor 19 is ON and the n-MOS transistors 20, 21 are OFF, is "0" when the n-MOS transistors 19, 20, 21, are all ON, and is "1" when the n-MOS transistors 19, 20 are ON and the n-MOS transistor 21 is OFF.

In contrast, when the current value of the cell current is less than the reference current value $I_1$, the output value of the sense circuit 22 is "1" when the n-MOS transistor 19 is ON and the n-MOS transistors 20, 21 are OFF, is "0" when the n-MOS transistors 19, 20, 21 are all ON, and is "0" when the n-MOS transistors 19, 20 are ON and the n-MOS transistor 21 is OFF.

In these cases, the output value of the comparison circuit 26 becomes "0", and it is possible to know that the charge accumulated in the floating gate of the cell transistor $2_{10}$ is reduced by the leak or disturbing resulting from breakdown and deterioration of the insulating film surrounding the floating gate.

As a result, it is possible to acquire the chance for effecting rewrite to the cell transistor $2_{10}$ in which the charge accumulated in the floating gate decreases, and for changing the cell transistor used.

Although rewriting and changing of the transistor to be used can be made by the use of a control circuit outside the device, it is also possible to dispose a control circuit for rewrite and exchange of the transistor used, and to effect rewrite and the change of the cell transistor used by the use of this control circuit.

Detection of the change of the memory state of the cell transistor and rewrite or switching of the cell transistor used can be efficiently made at the time of turning-ON of the power supply from the aspect of the system operation.

As described above, this embodiment can detect in advance the cell transistor having the possibility of the loss of the information and can acquire the chance for rewrite or the exchange of the transistor used in the same way as the first embodiment. Therefore, it can prevent the loss of information and can improve system reliability.

According to this embodiment, the intended object can be accomplished by merely adding the memory circuit 25 and the comparison circuit 26. Therefore, this embodiment does not invite the increase of the device area and the production cost in comparison with the prior art which incorporates the ECC circuit.

FIG. 4 shows the construction of principal portions of the semiconductor memory device according to the third embodiment of the present invention.

In this embodiment, the cell array portion 1, the bit line select circuit 3, the data bus 5, the load circuit 6, the sense circuit 9 for the output and the output circuit 10 are constituted in the same way as in the first embodiment shown in FIG. 1a. Therefore, the following description will explain the difference from the first embodiment.

In FIG. 4, reference numeral 29 denotes a cell array portion constituted by arranging cell transistors for memory state change detection for detecting the change of the memory state of the normal cell transistors $2_{00}$ to $2_{11}$, in array. (Only two cell transistors $30_0$, $30_1$ are shown for ease of explanation in the drawing.) Symbol DBL represents a bit line connected to these cell transistors $30_0$, $30_1$ for memory state change detection.

The cell transistors $30_0$, $30_1$ for the memory state change detection have the same construction as the cell transistors $2_{00}$ to $2_{11}$ for storing the state, and their control gates are connected to the corresponding word lines $WL_0$, $WL_1$, respectively.

Reference numeral 31 denotes a column gate for detecting the memory state change. DY is a bit line select signal for selecting the bit lines DBL for detecting the change of the memory state, and 32 is an n-MOS transistor ON/OFF of which is controlled by the bit line select signal DY.

Reference numeral 33 denotes a load circuit for detecting the change of the memory state, 34 is a power supply line for supplying the power supply voltage VCC, and 35 is an n-MOS transistor constituting a load transistor in the load circuit 33. Further, reference numeral 36 is a sense circuit for detecting the change of the memory state, 37 is an output circuit for outputting the memory state change detection signal outputted from the sense circuit 36 for detecting the change of the memory state, to the outside, and 38 is an output terminal of the memory state change detection information.

The sense circuit 36 for detecting the change of the memory state is constituted in such a manner that when the cell transistor for detecting the change of the memory state is brought into the read state, it uses a voltage occurring at a node 39 when the current value of the cell current is the reference current value $I_3$ (see FIG. 2) as a sense point (threshold level), judges "0" when the current value of the cell current is below the reference current value $I_3$, by judging that the cell transistor for detecting the change of the memory state is under the sufficient "0" storing state, and outputs "1" when the current value of the cell current exceeds the reference current value $I_3$, by judging that the cell transistor for detecting the change of the memory state is out of the sufficient "0" storing state.

In this embodiment, write of data to the cell transistors connected to the same word line is effected either simultaneously or continuously, and erase of the data is effected simultaneously. Accordingly, it is possible to assume that the magnitude of disturbing which the cell transistors receive when write or erase is effected to the cell transistors connected to the other word lines is equivalent between the cell transistors for storing the data and the cell transistors for detecting the change of the memory state.

For example, when write is effected to the data storing cell transistors $2_{00}$, $2_{01}$ connected to the word line $WL_0$, it is possible to regard that write is similarly made to the cell transistor $30_0$ for detecting the change of the memory state. Accordingly, when any of the cell transistors $2_{00}$, $2_{01}$ for storing the information is read out, the cell transistor $30_0$ for detecting the change of the memory state, too, is read out.

When the cell transistor for detecting the change of the memory state is brought into the read state, the sense circuit 36 for detecting the change of the memory state outputs "0" when the current value of the cell current is below the reference current value $I_3$, by judging that the cell transistor for detecting the change of the memory state is under the sufficient "0" storing state, and outputs "1" when the current value of the cell current exceeds the reference current value $I_3$, by judging that the cell transistor for detecting the change of the memory state is out of the sufficient "0" storing state.

Accordingly, assuming that "0" is stored in the cell transistor $2_{00}$ for storing the information and thereafter this cell transistor $2_{00}$ for storing the information and the cell transistor $30_0$ for detecting the change of the memory state are brought into the read state. Then, there occurs no problem in the case where "0" is outputted to the memory information output terminal 11 and then "0" is outputted to the memory state change detection information output terminal 38. However, when "1" is outputted to the memory state change detection information terminal 38, it can be known that the change of the floating gate of the memory state change detection cell transistor $30_0$ is reduced due to disturbing.

As described above, this embodiment can detect the occurrence of disturbing which invites the change of the information when the stored information is "0", and can thus acquire the chance for rewrite.

Rewriting to the cell transistors for storing the information and for detecting the change of the memory state can be made by the use of a control circuit outside the device, but it is also possible to dispose a control circuit for rewrite inside the device, and to make rewrite by the use of this control circuit. In connection with this point, detection of the change of the memory state of the cell transistor for detecting the change of the memory state and rewrite are efficiently made at the time of turning-ON of the power supply from the aspect of the system operation.

As described above, this embodiment can detect in advance the cell transistor having the possibility of the loss of information due to disturbing which invites the loss of the information when the stored information is "0", and can acquire the chance for rewrite. Accordingly, this embodiment can prevent the loss of the information and can improve system reliability.

According to this embodiment, the intended object can be accomplished by merely adding the load circuit 33, the sense circuit 36 and the output circuit 37, and the embodiment does not invite the increase of the device area and the production cost in comparison with the prior art device which incorporates the ECC circuit.

By the way, this embodiment is constituted in such a manner as to detect the occurrence of disturbing which invites the change of the information when the stored information is "0", but can also be constituted in such a manner as to detect the occurrence of disturbing inviting the change of the information when the stored information is "1", on the contrary. This can be accomplished by disposing a sense circuit which outputs "1" when the current value of the cell current is above the reference current value $I_2$ under the read state of the cell transistor for detecting the change of the memory state, by judging that the cell transistor for detecting the change of the memory state is under the sufficient "1" storing state, and outputs "0" when the current value of the cell current is less than the reference current value $I_2$, by judging that the cell transistor for detecting the change of the memory state is out of the sufficient "1" storing state.

Further, the construction can be attained in such a manner as to detect the occurrence of disturbing which invites the information change for both of "1" and "0". In this case, the memory state change detection cell transistor for storing "1" and the memory state change detection cell transistor for storing "0" are provided to the word lines $WL_0$, $WL_1$, and there is further provided a sense circuit which is constituted in such a manner as to output "0" when the current value of the cell current is below the reference current value $I_3$, by judging that the memory state change detection cell transistor is under the sufficient "0" storing state, and outputs "1" when the current value of the cell current exceeds the reference current value $I_3$, by judging that the memory state change detection cell transistor is out of the sufficient "0" storing state, so as to correspond to the memory state change detection cell transistor for storing "0". Also, there is further provided a sense circuit which outputs "1" when the current value of the cell current is above the reference current value $I_2$, by judging that the memory state change detection transistor is under the sufficient "1" storing state and outputs "0" when the current value of the cell current is less than the reference current value $I_2$, by judging that the memory state change detection transistor is out of the sufficient "1" storing state, so as to correspond to the memory state change detection cell transistor for storing "1".

The first to third embodiments given above represent the case where the present invention is applied to the NOR connection type flash memory, but the same effect can of course be obtained by applying the present invention to a NAND connection type flash memory, too.

Although each of the foregoing embodiments given above represents the case where the present invention is applied to the flash memory, the present invention can be applied similarly to other type of EEPROMs.

Although the present invention has thus been disclosed and described with reference to three embodiments thereof, other embodiments and modifications can obviously be made by those skilled in the art without departing from the essential and characterizing features of the present invention.

I claim:

1. An electrically erasable and programmable read-only semiconductor memory device comprising:

a first cell array portion formed by arranging in matrix a plurality of memory cell portions each having a cell transistor for storing information;

a second cell array portion formed by arranging in matrix a plurality of memory cell portions each including a memory state change detection cell transistor for detecting the change of the memory state of said cell transistor for storing the information;

means for selecting cell transistors for storing information in said first cell array portion;

a first sense circuit for reading out the stored information of said cell transistor for storing information selected; and a second sense circuit having a threshold level different from that of said first sense circuit, for reading out the stored information of said memory state change detection cell transistor when said memory state change detection cell transistor in said second cell array portion is selected.

2. An electrically erasable and programmable read-only semiconductor memory device according to claim 1, wherein said memory state change detection cell transistor in said second cell array portion has the same structure as that of said cell transistor for storing the information in said first cell array portion.

3. An electrically erasable and programmable read-able semiconductor memory device according to claim 1, wherein a plurality of word lines are disposed in common in such a manner as to extend through said first and second cell array portions, and said cell transistors for storing the information and said memory state change detection cell transistors in each of said cell array portions are arranged so as to share identical word lines.

4. An electrically erasable and programmable read-only semiconductor memory device according to claim 3, wherein a cell transistor for storing a first logical value and a cell transistor for storing a second logical value are connected as said memory state change detection cell transistors to each of a plurality of said word lines.

\* \* \* \* \*